United States Patent
Katz et al.

(10) Patent No.: US 11,353,493 B2
(45) Date of Patent: Jun. 7, 2022

(54) DATA-DRIVEN MISREGISTRATION PARAMETER CONFIGURATION AND MEASUREMENT SYSTEM AND METHOD

(71) Applicant: KLA-Tencor CORPORATION, Milpitas, CA (US)

(72) Inventors: Shlomit Katz, Beit Hanania (IL); Roie Volkovich, Migdal Ha'emek (IL); Anna Golotsvan, Qiryat Tivon (IL); Raviv Yohanan, Qiryat Motzkin (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 369 days.

(21) Appl. No.: 16/619,847

(22) PCT Filed: Jul. 10, 2019

(86) PCT No.: PCT/US2019/041095
§ 371 (c)(1),
(2) Date: Dec. 5, 2019

(87) PCT Pub. No.: WO2021/006890
PCT Pub. Date: Jan. 14, 2021

(65) Prior Publication Data
US 2021/0011073 A1    Jan. 14, 2021

(51) Int. Cl.
*G03F 7/20* (2006.01)
*G01R 31/26* (2020.01)
(Continued)

(52) U.S. Cl.
CPC ..... *G01R 31/2601* (2013.01); *G01N 21/9501* (2013.01); *G03F 7/705* (2013.01); *G03F 7/70633* (2013.01); *G05B 17/02* (2013.01)

(58) Field of Classification Search
CPC ............ G01R 31/2601; G01N 21/9501; G03F 7/705; G03F 7/70633; G05B 17/02; H01L 22/12; H01L 22/20
See application file for complete search history.

(56) References Cited

U.S. PATENT DOCUMENTS 8,214,771 B2*  7/2012  Adel ........................ H01L 22/12
                                                        716/52
9,910,953 B2*  3/2018  Adel ..................... G06F 30/398
(Continued)

FOREIGN PATENT DOCUMENTS

KR    20110095363 A    8/2011
KR    20170015453 A    2/2017

OTHER PUBLICATIONS

Seidel et al., "Improving registration metrology by correlation methods based on alias-free image simulation", Photomask Technology, vol. 7823, p. 78232N, SPIE, 2010.
(Continued)

*Primary Examiner* — Jonathan M Hansen
(74) *Attorney, Agent, or Firm* — Hodgson Russ LLP

(57) ABSTRACT

A data-driven misregistration parameter configuration and measurement system and method including simulating a plurality of measurement simulations of at least one multi-layered semiconductor device, selected from a batch of multilayered semiconductor devices intended to be identical, using sets of measurement parameter configurations, generating simulation data for the device, identifying recommended measurement parameter configurations selected from sets of measurement parameter configurations, providing a multilayered semiconductor device selected from the batch, providing the at least one recommended set of measurement parameter configurations to a misregistration metrology tool having multiple possible sets of measurement parameter configurations, measuring at least one mul-
(Continued)

tilayered semiconductor device, selected from the batch, using the recommended set, thereby generating measurement data for the device, thereafter identifying a final recommended set of measurement parameter configurations and measuring misregistration of at least one multilayered semiconductor device, selected from the batch, using the final recommended set.

19 Claims, 2 Drawing Sheets

(51) Int. Cl.
     *G05B 17/02*      (2006.01)
     *G01N 21/95*      (2006.01)

(56) References Cited

U.S. PATENT DOCUMENTS

| | | |
|---|---|---|
| 2004/0102934 A1* | 5/2004 | Chang ............... G03F 7/70525 703/1 |
| 2005/0027388 A1 | 2/2005 | Byers et al. |
| 2007/0246844 A1 | 10/2007 | Do et al. |
| 2010/0175033 A1 | 7/2010 | Adel et al. |
| 2015/0346605 A1 | 12/2015 | Den Boef et al. |

OTHER PUBLICATIONS

WIPO, ISR for PCT/US2019/041095, Apr. 9, 2020.

* cited by examiner

DATA-DRIVEN MISREGISTRATION PARAMETER CONFIGURATION AND MEASUREMENT SYSTEM AND METHOD

REFERENCE TO RELATED APPLICATIONS

Reference is hereby made to the following patents, which are related to the subject matter of the present application, the disclosures of Which are hereby incorporated by reference:

Applicant's U.S. Pat. No. 8,214,771, entitled SCATTEROMETRY METROLOGY TARGET DESIGN OPTIMIZATION, and issued on Jul. 3, 2012; and Applicant's U.S. Pat. No. 9,910,953, entitled METROLOGY TARGET IDENTIFICATION, DESIGN AND VERIFICATION, and issued on Mar. 6, 2018.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a data-driven misregistration parameter configuration and measurement method including simulating a plurality of measurement simulations of at least one multilayered semiconductor device, selected from a batch of multilayered semiconductor devices intended to be identical, using a Plurality of sets of measurement parameter configurations, thereby generating simulation data for the at least one multilayered semiconductor device, identifying at least one set of recommended measurement parameter configurations, which is selected from the plurality of sets of measurement parameter configurations, providing a multilayered semiconductor device selected from the batch of multilayered semiconductor devices, providing the at least one recommended set of measurement parameter configurations to a misregistration metrology tool having multiple possible sets of measurement parameter configurations, measuring at least one multilayered semiconductor device, selected from the batch of multilayered to semiconductor devices intended to be identical, using the at least one recommended set of measurement parameter configurations, thereby generating measurement data for the at least one multilayered semiconductor device, thereafter identifying a final recommended set of measurement parameter configurations and measuring misregistration of at least one multilayered semiconductor device, selected from the batch of multilayered semiconductor devices intended to be identical, using the final recommended set of measurement parameter configurations.

In accordance with a preferred embodiment of the present invention, the final recommended set of measurement parameter configurations is identified based on best results of the measurement data for the at least one multilayered semiconductor device.

Preferably, the plurality of measurement simulations are metrology target, design simulations. Preferably, the at least one recommended set of measurement parameter configurations is identified based on at least one of inaccuracy, Qmerit, focus sensitivity, throughput and contrast precision.

In accordance with a preferred embodiment of the present invention, the sets of measurement parameter configurations include at least one of an axis along which misregistration is measured, a region of interest of a metrology target, a numerical aperture used in misregistration measurement, a polarization of light used in misregistration measurement, wavelengths of light used in misregistration measurement, bandwidth of wavelengths of light used in misregistration measurement, an intensity of light used in misregistration measurement a focal depth used in misregistration measurement and an apodizer used in misregistration measurement.

In accordance with a preferred embodiment of the present invention, the misregistration metrology tool is an imaging misregistration metrology tool. Alternatively, in accordance with a preferred embodiment of the present invention, the misregistration metrology tool is a scatterometry misregistration metrology tool.

In accordance with a preferred embodiment of the present invention the data-driven misregistration parameter configuration and measurement method also includes generating simulation signal data and comparing the simulation signal data to the measurement data for the at least one multilayered semiconductor device.

Preferably, the simulation signal data includes at least one of contrast, sensitivity and pupil image. Preferably, the data-driven misregistration parameter configuration and measurement method also includes indicating for which of the sets of measurement parameter configurations and fir which portions of the multilayered semiconductor device a mismatch between the simulation signal data and the measurement data occurs and indicating possible root causes of the mismatch.

There is also provided in accordance with another preferred embodiment of the present invention a data-driven misregistration parameter configuration and measurement system including a semiconductor device measurement simulator, operative to simulate a plurality of measurement simulations of at least one multilayered semiconductor device, selected from a batch of multilayered semiconductor devices intended to be identical, using a plurality of sets of measurement parameter configurations, thereby generating simulation data for the at least one multilayered semiconductor device, a simulation data analyzer, operative to identify at least one recommended set of measurement parameter configurations, which is selected from the plurality of sets of measurement parameter configurations and a misregistration metrology tool having multiple possible sets of measurement parameter configurations, operative to receive the at least one recommended set of measurement parameter configurations and to measure misregistration of at least one multilayered semiconductor device, selected from the batch of multilayered semiconductor devices intended to be identical, using the at least one recommended set of measurement parameter configurations, thereby generating measurement data for the at least one multilayered semiconductor device.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
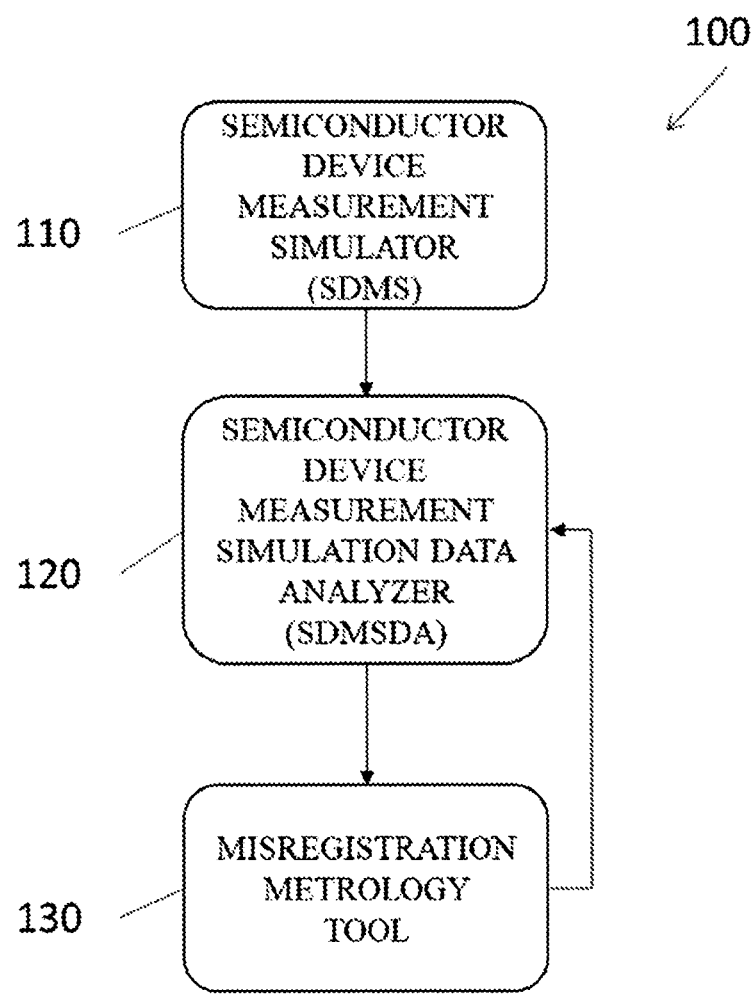
FIG. 1 is a simplified schematic illustration of a data-driven misregistration parameter configuration and measurement system.

Reference is now made to FIG. 1, which is a simplified schematic illustration of a data-driven misregistration parameter configuration and measurement system (DDMPCMS) 100. As seen in FIG. 1, DDMPCMS 100 includes a semiconductor device measurement simulator (SDMS) 110. SDMS 110 is operative to simulate a plurality of measurement's of a multilayered semiconductor device, selected from a batch of multilayered semiconductor devices intended to be identical, using a plurality of measurement parameter configurations, thereby generating simulation data for the multilayered semiconductor device.

In a preferred embodiment of the present invention, SDMS 110 is embodied as a metrology target design (MTD) simulator, such as the one described in U.S. Pat. No. 8,214,771 or in U.S. Pat. No. 9,910,953, the disclosures of which are hereby incorporated by reference.

Preferably, SDMS 110 simulates a plurality of MTD simulations of at least one multilayered semiconductor device, selected from a batch of multilayered semiconductor devices intended to be identical, generating simulation data for the multilayered semiconductor device. Preferably, the MTD simulations include simulations of misregistration measurements designed to be measured by either imaging or scatterometry misregistration tools. Preferably, SDMS 110 simulates each misregistration measurement for the at least one multilayered semiconductor device using a different set of measurement parameter configurations.

Parameters used in the MTD simulations including misregistration, measurements designed to be measured by imaging misregistration tools may include, inter alia, an axis along which misregistration is measured, a region of interest of a metrology target, a numerical aperture used in misregistration measurement, a polarization of light used in misregistration measurement, wavelengths of light used in misregistration measurement, bandwidth of wavelengths of light used in misregistration measurement, an intensity of light used in misregistration measurement and a focal depth used in misregistration measurement. Parameters used in the MTD simulations including misregistration measurements designed to be measured by scatterometry misregistration tools may include, inter alia, an axis along which misregistration is measured, a region of interest of a metrology target, an apodizer used in misregistration measurement, a polarization of light used in misregistration measurement, wavelengths of light used in misregistration measurement, bandwidth of wavelengths of light used in misregistration measurement, an intensity of light used in misregistration measurement and a focal depth used in misregistration measurement.

In an alternative embodiment of the present invention, SDMS 110 simulates a plurality of simulation-to-measurement (S2M) simulations of at least one multilayered semiconductor device, selected from a batch of multilayered semiconductor devices intended to be identical, generating simulation data for the multilayered semiconductor device. Preferably, the S2M simulations' input includes characteristics of the multilayered semiconductor device. The characteristics may include, inter alma, index of refraction and dielectric constant. Preferably, SDMS 110 simulates each measurement for the at least one multilayered semiconductor device using a different set of measurement parameter configurations, and generates expected simulation signal data from each measurement. Expected simulation signal data may include, inter alia, contrast, sensitivity and pupil image.

DDMPCMS 100 preferably further includes a semiconductor device measurement simulation data analyzer (SDMSDA) 120, which analyzes simulation data for the at least one multilayered semiconductor device generated by SDMS 110 and identifies at least one recommended measurement parameter configuration, which is selected from the plurality of measurement parameter configurations used in the simulations run by SDMS 110.

In a preferred embodiment of the present invention, SDMSDA 120 evaluates quality metrics of the simulation data generated by SDMS 110. Quality metrics may include, inter alia, inaccuracy, Qmerit, focus sensitivity, throughput and contrast precision. The quality metrics of each simulation are compared to each other, and the measurement parameter configurations of the simulations having the most desirable quality metrics are identified as recommended measurement parameter configurations.

DDMPCMS 100 preferably further includes a misregistration metrology tool 130 having multiple possible measurement parameter configurations. Misregistration metrology tool 130 uses the at least one recommended measurement parameter configuration identified by SDMSDA 120 to measure a multilayered semiconductor device intended to be identical to the multilayered semiconductor device simulated by SDMS 110. In a preferred embodiment of the present invention, misregistration metrology tool 130 measures the multilayered semiconductor device with each of the plurality of recommended measurement parameter configurations, and a final measurement parameter configuration is chosen based on best results of measurements performed by misregistration metrology tool 130.

Misregistration metrology tool 130 is preferably embodied either as an imaging misregistration metrology tool or as a scatterometry misregistration metrology tool. A typical imaging misregistration metrology tool, useful as misregistration metrology tool 130, is an Archer™ 600, commercially available from KLA Corporation of Milpitas, Calif., USA. A typical scatterometry misregistration metrology tool, useful as misregistration metrology tool 130, is an ATL™ 100, commercially available from KLA Corporation of Milpitas, Calif., USA.

In a case wherein SDMS 110 simulates S2M measurements, SDMSDA 120 compares the expected simulation signal data generated by SDMS 110 to the actual signal data generated by misregistration metrology tool 130. Signal data may include, inter alia, contrast, sensitivity and pupil image. If the difference between the expected and actual signal data exceeds a predetermined threshold, SDMSDA 120 preferably indicates for which sets of measurement parameter configurations used by misregistration metrology tool 130 and for which portions of the multilayered semiconductor device a mismatch between the simulation signal data and the measurement data occurs, and further indicates possible root causes of the mismatch.

Figure 2:
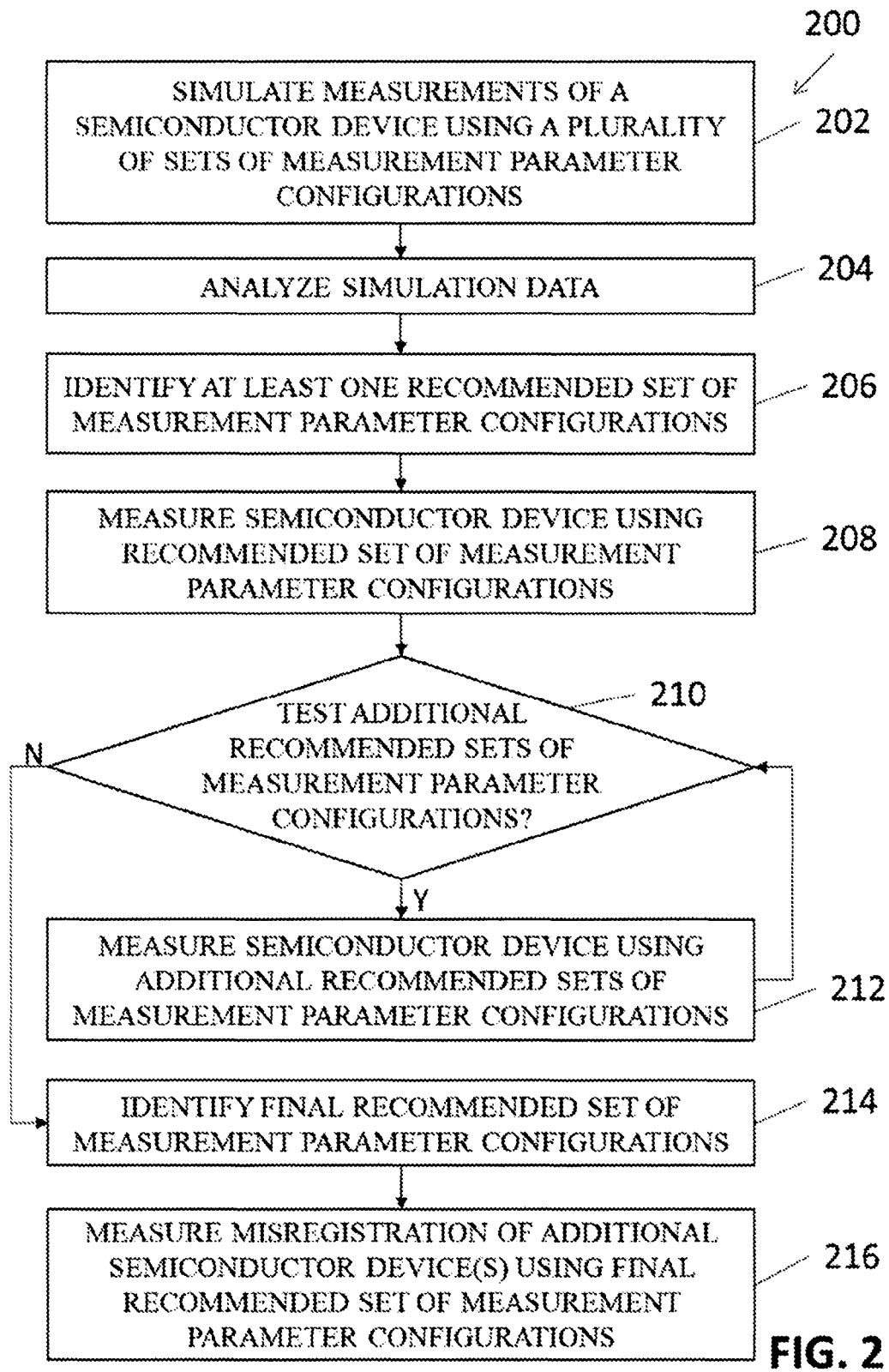
FIG. 2 is a simplified flow chart illustrating a data-driven misregistration parameter configuration and measurement method useful by the data-driven misregistration parameter configuration and measurement system of FIG. 1.

Reference is now made to FIG. 2, which is, a simplified flow chart illustrating a data-driven misregistration parameter configuration and measurement method 200 useful by DDMPCMS 100.

As seen at a first step 202, SDMS 110 simulates a plurality of measurements of a multilayered semiconductor device, selected from a batch of multilayered semiconductor devices intended to be identical, using a plurality of measurement parameter configurations, thereby generating simulation data for the multilayered semiconductor device.

In a preferred use case. SDMS 110 simulates a plurality of MTD simulations of at least one multilayered semiconductor device, selected from a batch of multilayered semiconductor devices intended to be identical, generating simulation data for each of the at least one multilayered semiconductor device. Preferably, the MTD simulations include misregistration measurements designed to be measured by either imaging or scatterometry misregistration tools. Preferably, SDMS 110 simulates each misregistration measurement for each of the at least one multilayered semiconductor device using a different set of measurement parameter configurations.

Parameters used in the MTD simulations including misregistration measurements designed to be measured by imaging misregistration tools may include, inter alia, an axis along which misregistration is measured, a region of interest of a metrology target, a numerical aperture used in misregistration measurement, a polarization of light used in misregistration measurement, wavelengths of light used in misregistration measurement, bandwidth of wavelengths of light used in misregistration measurement, an intensity of light used in misregistration measurement and a focal depth used in misregistration measurement. Parameters used in the MTD simulations including misregistration measurements designed to be measured by scatterometry misregistration tools may include, inter alma, an axis along which misregistration is measured, a region of interest of a metrology target, an apodizer used in misregistration measurement, a polarization of light used in misregistration measurement, wavelengths of light used in misregistration measurement, bandwidth of wavelengths of light used in misregistration measurement, an intensity of light used in misregistration measurement and a focal depth used in misregistration measurement.

Following step 202, at a next step 204, SDMSDA 120 analyzes simulation data generated at step 202. Then, at a next step 206, SDMSDA 120 identifies at least one recommended measurement parameter configuration, which is selected from the plurality of measurement parameter configurations used at step 202.

At step 204, SDMSDA 120 evaluates quality metrics of the simulation data generated at step 202. Quality metrics may include, inter alia, inaccuracy, Qmerit, focus sensitivity, throughput and contrast precision. The quality metrics of each simulation are compared to each other, and at step 206, at least one set of measurement parameter configurations of the simulations having the most desirable quality metrics is identified as at least one recommended set of measurement parameter configurations.

At a next step 208, misregistration metrology tool 130 uses at least one set of recommended measurement parameter configurations, selected from the at least one recommended set of measurement parameter configurations identified at step 206, to measure a multilayered semiconductor device intended to be identical to the multilayered semiconductor device simulated at step 202. Then, at a next step 210, a decision is made whether or not to measure a multilayered semiconductor device, intended to be identical to the multilayered semiconductor device simulated at step 202, using an additional set of recommended measurement parameter configurations, selected from the at least one recommended set of measurement parameter configurations identified at step 206.

As seen at a next step 212, if a multilayered semiconductor device intended to be identical to the multilayered semiconductor device simulated at step 202 is to be measured using an additional set of recommended measurement parameter configurations, selected from the at least one recommended set of parameter configurations identified at step 206, misregistration metrology tool 130 uses an additional set of recommended measurement parameter configurations, selected from the at least one recommended set of measurement parameter configurations identified at step 206, to measure a multilayered semiconductor device intended to be identical to the multilayered semiconductor device simulated at step 202.

Following step 212, the method 200 returns to step 210 and a decision is made whether or not to measure a multilayered semiconductor device intended to be identical to the multilayered semiconductor device simulated at step 202 using an additional set of recommended measurement parameter configurations, selected from the at least one recommended set of parameter configurations identified at step 206.

As seen at a next step 214, if a multilayered semiconductor device intended to be identical to the multilayered semiconductor device simulated at step 202 is not to be measured using an additional set of recommended measurement parameter configurations, selected from the at least one recommended set of measurement parameter configurations identified at step 206, a final recommended set of measurement parameter configurations is identified. In a preferred embodiment of the present invention, the final set of recommended measurement parameter configurations is identified based on best results of measurements performed in steps 208 and 212.

In a case wherein SDMS 110 simulates S2M measurements, during step 214, SDMSDA 120 compares the expected simulation signal data generated at step 202 to the actual signal data generated at steps 208 and 212. Signal data may include, inter alia, contrast, sensitivity and pupil image. If the difference between the expected and actual signal data exceeds a predetermined threshold, at step 214 SDMSDA 120 indicates for which sets of measurement parameter configurations used by misregistration metrology tool 130 and for which portions of the multilayered semiconductor device a mismatch between the simulation signal data and the measurement data occurs, and further indicates possible root causes of the mismatch.

As seen at a next step 216, misregistration metrology tool 130 uses the final recommended set of measurement parameter configurations identified at step 214 to measure at least one additional multilayered semiconductor device, intended to be identical to the multilayered semiconductor device simulated at step 202.

It wilt be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A data-driven misregistration parameter configuration and measurement method comprising:
   simulating a plurality of measurement simulations of at least one multilayered semiconductor device, selected from a batch of multilayered semiconductor devices intended to be identical, using a plurality of sets of measurement parameter configurations, thereby generating simulation data for said at least one multilayered semiconductor device;
   identifying at least one set of recommended measurement parameter configurations, which is selected from said plurality of sets of measurement parameter configurations;
   providing a multilayered semiconductor device selected from said batch of multilayered semiconductor devices;
   providing said at least one recommended set of measurement parameter configurations to a misregistration metrology tool having multiple possible sets of measurement parameter configurations;
   measuring at least one multilayered semiconductor device, selected from said batch of multilayered semiconductor devices intended to be identical, using said at least one recommended set of measurement parameter configurations, thereby generating measurement data for said at least one multilayered semiconductor device;
   thereafter identifying a final recommended set of measurement parameter configurations; and
   measuring misregistration of at least one multilayered semiconductor device, selected from said batch of multilayered semiconductor devices intended to be identical, using said final recommended set of measurement parameter configurations.

2. The data-driven misregistration parameter configuration and measurement method of claim 1 wherein said final recommended set of measurement parameter configurations is identified based on best results of said measurement data for said at least one multilayered semiconductor device.

3. The data-driven misregistration parameter configuration and measurement method of claim 1, wherein said plurality of measurement simulations are metrology target design simulations.

4. The data-driven misregistration parameter configuration and measurement method of claim 3, wherein said at least one recommended set of measurement parameter configurations is identified based on at least one of:
   inaccuracy;
   Qmerit;
   focus sensitivity;
   throughput; or
   contrast precision.

5. The data-driven misregistration parameter configuration and measurement method of claim 1, wherein said sets of measurement parameter configurations comprise at least one of:
   an axis along which misregistration is measured;
   a region of interest of a metrology target;
   a numerical aperture used in misregistration measurement;
   a polarization of light used in misregistration measurement;
   wavelengths of light used in misregistration measurement;
   bandwidth of wavelengths of light used in misregistration measurement;
   an intensity of light used in misregistration measurement;
   a focal depth used in misregistration measurement; or
   an apodizer used in misregistration measurement.

6. The data-driven misregistration parameter configuration and measurement method of claim 1, wherein said misregistration metrology tool is an imaging misregistration metrology tool.

7. The data-driven misregistration parameter configuration and measurement method of claim 1, wherein said misregistration metrology tool is a scatterometry misregistration metrology tool.

8. The data-driven misregistration parameter configuration and measurement method of claim 1, further comprising:
   generating simulation signal data; and
   comparing said simulation signal data to said measurement data for said at least one multilayered semiconductor device.

9. The data-driven misregistration parameter configuration and measurement method of claim 8, wherein said simulation signal data includes at least one of:
   contrast;
   sensitivity; or
   pupil image.

10. The data-driven misregistration parameter configuration and measurement method of claim 8, further comprising:
    indicating for which of said sets of measurement parameter configurations and for which portions of said multilayered semiconductor device a mismatch between said simulation signal data and said measurement data occurs; and
    indicating possible root causes of said mismatch.

11. A data-driven misregistration parameter configuration and measurement system comprising:
    a semiconductor device measurement simulator, operative to simulate a plurality of measurement simulations of at least one multilayered semiconductor device, selected from a batch of multilayered semiconductor devices intended to be identical, using a plurality of sets of measurement parameter configurations, thereby generating simulation data for said at least one multilayered semiconductor device;
    a simulation data analyzer, operative to identify at least one recommended set of measurement parameter configurations, which is selected from said plurality of sets of measurement parameter configurations; and
    a misregistration metrology tool having multiple possible sets of measurement parameter configurations, operative to receive said at least one recommended set of measurement parameter configurations and to measure misregistration of at least one multilayered semiconductor device, selected from said batch of multilayered semiconductor devices intended to be identical, using said at least one recommended set of measurement parameter configurations, thereby generating measurement data for said at least one multilayered semiconductor device.

12. The data-driven misregistration parameter configuration and measurement system of claim 11, wherein said semiconductor device measurement simulator is a metrology target design simulator.

13. The data-driven misregistration parameter configuration and measurement system of claim 12, wherein said at least one recommended set of measurement parameter configurations is identified based on at least one of:

inaccuracy;
Qmerit;
focus sensitivity;
throughput; or
contrast precision.

14. The data-driven misregistration parameter configuration and measurement system of claim 11, wherein said sets of measurement parameter configurations comprise at least one of:
   an axis along which misregistration is measured;
   a region of interest of a metrology target;
   a numerical aperture used in misregistration measurement;
   a polarization of light used in misregistration measurement;
   wavelengths of light used in misregistration measurement;
   bandwidth of wavelengths of light used in misregistration measurement;
   an intensity of light used in misregistration measurement;
   a focal depth used in misregistration measurement; or
   an apodizer used in misregistration measurement.

15. The data-driven misregistration parameter configuration and measurement system of claim 11, wherein said misregistration metrology tool is an imaging misregistration metrology tool.

16. The data-driven misregistration parameter configuration and measurement system of claim 11, wherein said misregistration metrology tool is a scatterometry misregistration metrology tool.

17. The data-driven misregistration parameter configuration and measurement system of claim 11, wherein said simulation data analyzer is further operative to compare said simulation data to said measurement data.

18. The data-driven misregistration parameter configuration and measurement system of claim 17, wherein said simulation signal data includes at least one of:
   contrast;
   sensitivity; or
   pupil image.

19. The data-driven misregistration parameter configuration and measurement system of claim 17, wherein said simulation data analyzer is further operative to:
   indicate for which of said sets of measurement parameter configurations and for which portions of said multilayered semiconductor device a mismatch between said simulation signal data and said measurement data occurs; and
   indicate possible root causes of said mismatch.

* * * * *